(12) United States Patent
Lee et al.

(10) Patent No.: US 9,385,314 B2
(45) Date of Patent: Jul. 5, 2016

(54) MEMORY CELL OF RESISTIVE RANDOM ACCESS MEMORY AND MANUFACTURING METHOD THEREOF

(71) Applicant: Industrial Technology Research Institute, Hsinchu (TW)

(72) Inventors: Heng-Yuan Lee, Hsinchu County (TW); Pei-Yi Gu, Hsinchu County (TW); Yu-Sheng Chen, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/510,135

(22) Filed: Oct. 9, 2014

(65) Prior Publication Data
US 2015/0021542 A1    Jan. 22, 2015

Related U.S. Application Data

(63) Continuation-in-part of application No. 13/719,245, filed on Dec. 19, 2012, now abandoned, which is a continuation-in-part of application No. 12/334,203, filed on Dec. 12, 2008, now Pat. No. 8,362,454.

(30) Foreign Application Priority Data

Aug. 12, 2008   (TW) ............................... 97130654 A
May 30, 2012   (TW) ............................ 101119371 A

(51) Int. Cl.
*H01L 45/00* (2006.01)
*H01L 27/24* (2006.01)

(52) U.S. Cl.
CPC ............ *H01L 45/1233* (2013.01); *H01L 45/08* (2013.01); *H01L 45/1253* (2013.01); *H01L 45/146* (2013.01); *H01L 45/1641* (2013.01); *H01L 27/2436* (2013.01)

(58) Field of Classification Search
CPC .. H01L 45/1233; H01L 45/04; H01L 45/1625
USPC ................. 257/3, E21.008, E21.59, E21.647; 438/382, 656
See application file for complete search history.

(56) References Cited

U.S. PATENT DOCUMENTS 364,373 A     6/1887   Reisch
6,831,854 B2  12/2004  Rinerson et al.
(Continued)

FOREIGN PATENT DOCUMENTS

TW            412764       11/2000
TW         200820469        5/2008

OTHER PUBLICATIONS

Baek et al., "Highly Scalable Non-volatile Resistive Memory using Simple Binary Oxide Driven by Asymmetric Unipolar Voltage Pulses", IEEE International Electron Devices Meeting, Dec. 13-15, 2004, p. 1-p. 4.

(Continued)

*Primary Examiner* — Thomas L Dickey
(74) *Attorney, Agent, or Firm* — Jianq Chyun IP Office

(57) ABSTRACT

A memory cell of a resistive random access memory and a manufacturing method thereof are provided. The method includes the following steps. A first electrode is formed. A metal oxide layer is formed on the first electrode. An electrode buffer stacked layer is formed on the metal oxide layer and includes a first buffer layer and a second buffer layer, and the first buffer layer is located between the second buffer layer and the metal oxide layer. The second buffer layer reacts with oxygen from the first buffer layer more strongly than the first buffer layer reacts with oxygen from the metal oxide layer. A second electrode layer is formed on the electrode buffer stacked layer.

16 Claims, 3 Drawing Sheets

(56) References Cited

U.S. PATENT DOCUMENTS

| | | |
|---|---|---|
| 6,849,891 B1 | 2/2005 | Hsu et al. |
| 7,579,612 B2 | 8/2009 | Tang et al. |
| 7,799,653 B2 | 9/2010 | Lee et al. |
| 8,362,454 B2 | 1/2013 | Lee et al. |
| 2004/0012047 A1 | 1/2004 | Lin et al. |
| 2004/0159828 A1 | 8/2004 | Rinerson et al. |
| 2004/0160841 A1* | 8/2004 | Rinerson ............ G11C 13/0007 365/230.02 |
| 2004/0262663 A1 | 12/2004 | Lin et al. |
| 2005/0019975 A1 | 1/2005 | Lee et al. |
| 2005/0145910 A1 | 7/2005 | Tamai et al. |
| 2006/0291268 A1 | 12/2006 | Happ et al. |
| 2007/0048990 A1 | 3/2007 | Zhuang et al. |
| 2007/0159868 A1 | 7/2007 | Sugita et al. |
| 2007/0200158 A1 | 8/2007 | Genrikh et al. |
| 2007/0215977 A1 | 9/2007 | Lee et al. |
| 2007/0228370 A1 | 10/2007 | Lee et al. |
| 2007/0257257 A1 | 11/2007 | Cho et al. |
| 2007/0269683 A1 | 11/2007 | Chen et al. |
| 2007/0290186 A1 | 12/2007 | Bourim et al. |
| 2007/0295950 A1 | 12/2007 | Cho et al. |
| 2008/0116438 A1 | 5/2008 | Lee et al. |
| 2008/0164568 A1 | 7/2008 | Lee et al. |
| 2008/0278990 A1 | 11/2008 | Kumar et al. |
| 2009/0008620 A1 | 1/2009 | Baek et al. |
| 2009/0117697 A1 | 5/2009 | Park et al. |
| 2009/0189159 A1 | 7/2009 | Enicks et al. |
| 2009/0272959 A1 | 11/2009 | Phatak et al. |
| 2009/0273964 A1 | 11/2009 | Yamazaki et al. |
| 2010/0019219 A1 | 1/2010 | Lee |
| 2010/0258782 A1 | 10/2010 | Kuse et al. |
| 2011/0140068 A1 | 6/2011 | Ozawa et al. |
| 2011/0227024 A1 | 9/2011 | Sekar et al. |
| 2011/0299322 A1 | 12/2011 | Iijima et al. |
| 2013/0051119 A1 | 2/2013 | Lee et al. |
| 2013/0193396 A1 | 8/2013 | Nakano et al. |

OTHER PUBLICATIONS

Tsunoda et al., "Low Power and High Speed Switching of Ti-doped NiO ReRAM under the Unipolar Voltage Source of less than 3 V", IEEE International Electron Devices Meeting, Dec. 10-12, 2007, p. 1-p. 4.

Wei et al., "Highly Reliable TaOx ReRAM and Direct Evidence of Redox Reaction Mechanism", IEEE International Electron Devices Meeting, Dec. 15-17, 2008, p. 1-p. 4.

Lee et al., "Low Power and High Speed Bipolar Switching with a Thin Reactive Ti Buffer Layer in Robust HfO2 Based RRAM", IEEE International Electron Devices Meeting, Dec. 15-17, 2008, p. 1-p. 4.

Lee et al., "HfO2 Bipolar Resistive Memory Device with Robust Endurance using AlCu as Electrode", International Symposium on VLSI Technology, Systems and Applications, Apr. 21-23, 2008, p. 1-p. 2.

"Office Action of Taiwan Counterpart Application", issued on Oct. 14, 2014, p. 1-p. 6.

* cited by examiner

MEMORY CELL OF RESISTIVE RANDOM ACCESS MEMORY AND MANUFACTURING METHOD THEREOF

CROSS-REFERENCE TO RELATED APPLICATION

This application is a continuation-in-part application of and claims the priority benefit of a prior application Ser. No. 13/719,245, filed on Dec. 19, 2012, now pending, which claims the priority benefit of Taiwan application serial no. 101119371, filed on May 30, 2012. The prior application Ser. No. 13/719,245 is a continuation-in-part application of and claims the priority benefit of a prior application Ser. No. 12/334,203, filed on Dec. 12, 2008, which claims the priority benefit of Taiwan application serial no. 97130654, filed on Aug. 12, 2008. The entirety of each of the above-mentioned patent applications is hereby incorporated by reference herein and made a part of this specification.

TECHNICAL FIELD

The disclosure relates to a memory cell of a resistive random access memory (RRAM) and a manufacturing method thereof.

BACKGROUND

A resistive random access memory (RRAM) is a memory device using a material with a resistance characteristic thereof varied along with external influence. Since the resistance is not changed after power-off, the RRAM is a non-volatile memory.

Presently, the RRAM using a single metal electrode as an oxygen atom absorbing layer has been proved to have a variety of excellent memory characteristics, but such type of memory has a problem of that the first time reset current during a current scaling process is excessive. Moreover, although the problem of excessive first time reset current can be overcome when a metal that is difficult to react with oxide is used in the RRAM, the RRAM using such metal has a problem of that the forming voltage is large.

SUMMARY

The disclosure provides a method for manufacturing a memory cell of a RRAM, which includes the following steps. A first electrode is formed. A metal oxide layer is formed on the first electrode. An electrode buffer stacked layer is formed on the metal oxide layer, where the electrode buffer stacked layer includes a first buffer layer and a second buffer layer, and the first buffer layer is located between the second buffer layer and the metal oxide layer. The second buffer layer reacts with oxygen from the first buffer layer more strongly than the first buffer layer reacts with oxygen from the metal oxide layer. A second electrode is formed on the electrode buffer stacked layer.

The disclosure provides a memory cell of a RRAM, which includes a first electrode, a second electrode, a metal oxide layer and an electrode buffer stacked layer. The metal oxide layer is located between the first electrode and the second electrode. The electrode buffer stacked layer is located between the first electrode and the second electrode, where the electrode buffer stacked layer includes a first buffer layer and a second buffer layer, and the first buffer layer is located between the second buffer layer and the metal oxide layer. The second buffer layer reacts with oxygen from the first buffer layer more strongly than the first buffer layer reacts with oxygen from the metal oxide layer.

In order to make the aforementioned and other features of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
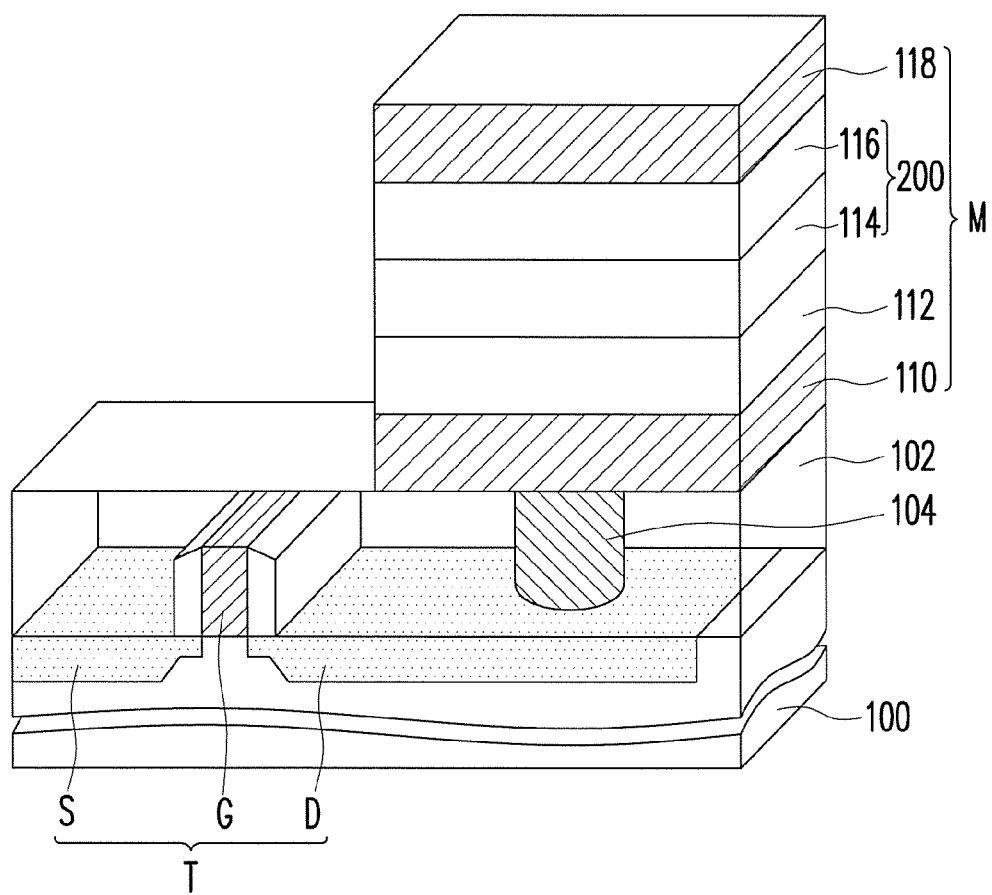
FIG. 1 is a schematic diagram of a resistive random access memory (RRAM) according to an embodiment of the disclosure.

FIG. 1 is a schematic diagram of a resistive random access memory (RRAM) according to an embodiment of the disclosure. In FIG. 1 and the following descriptions, one memory unit in the RRAM is taken as an example for descriptions, and the RRAM includes a plurality of memory units.

Referring to FIG. 1, a method for manufacturing the RRAM of the present embodiment is as follows. A substrate 100 is provided, where the substrate 100 has a control device T formed thereon, which is electrically connected to a bit line (not shown). In the present embodiment, the substrate 100 is, for example, a silicon substrate or other suitable semiconductor substrates. The control device T is, for example, a metal oxide semiconductor (MOS) transistor, which includes a gate G, a source S and a drain D. The type of the control device T is not limited, and other types of semiconductor devices that can be used to control a memory cell of the RRAM can also serve as the control device T.

Then, a memory cell M is formed on the substrate 100. Here, before the memory cell M is formed, an insulation layer 102 is first formed on the substrate 100 to cover the control device T. Then, a contact window 104 is formed in the insulation layer 102, and the contact window 104 is electrically connected to the control device T. Here, the insulation layer 102 may include silicon oxide, silicon nitride, silicon oxynitride, or other suitable insulation materials. A method of forming the contact window 104 is, for example, to pattern the insulation layer 102 though a photolithography and etching process to form a contact window opening (not shown), and then a metal or a conductive material with good conductivity is filled in the contact window opening.

The step of forming the memory cell M includes forming a first electrode 110 on the insulation layer 102. Here, the first electrode 110 is electrically connected to the control device T through the contact window 104, so that the memory cell M is electrically connected to the control device T. The first electrode 110 includes an electrode material capable of blocking diffusion of oxygen atoms. In other words, regarding selection of the material of the first electrode 110, the properties of blocking diffusion of the oxygen atoms and enough thermal stability are generally considered. In this way, in a post heat treatment process, the first electrode 110 can block or barrier diffusion of the oxygen atoms under a temperature condition of the heat treatment. According to the above description, the material of the first electrode 110 preferably includes TaN, TiN, TiAlN, a TiW alloy, Pt, W, Ru or a mixture or a stacked layer of the above materials. Moreover, a thickness of the first electrode 110 is about 5~500 nm.

Then, a metal oxide layer 112 is formed on the first electrode 110 to serve as a variable resistor film of the memory cell M. The metal oxide layer 112 is a binary oxide, and a chemical formula thereof is MxOy, in which M represents Al, Hf, Ti, Ta, Zr or other metal elements capable of presenting resistance transform, and x and y present a stoichiometric ratio or a non-stoichiometric ratio. Here, the so-called stoichiometric ratio refers to that the metal atoms and the oxygen atoms exist in a way of satisfying the stoichiometric, for example, aluminium oxide is Al2O3. However, x and y of MxOy of the metal oxide layer 112 are not limited to must satisfy the stoichiometric ratio. According to an embodiment, the resistance-variable metal oxide layer 112 MxOy of the memory cell M is preferably to have a non-stoichiometric ratio between x and y, though the disclosure is not limited thereto.

Then, a first buffer layer 114 is formed on the metal oxide layer 112. Here, a main consideration in selection of a material of the first buffer layer 114 is that such material is not easy to have an oxidation reaction with the metal oxide (the metal oxide layer 112), and is capable of suppressing excessive first time reset current of the memory device. Therefore, the material of the first buffer layer 114 preferably includes Ta, Zr, Hf, Al, Ni, or other metals that are not easy to have the oxidation reaction with the metal oxide layer or a metal oxide of the above metal that is not fully oxidized. Moreover, a thickness of the first buffer layer 114 is 1~100 nm, which is preferably 1~10 nm.

Then, a second buffer layer 116 is formed on the first buffer layer 114. The first buffer layer 114 and the second buffer layer 116 form an electrode buffer stacked layer 200. In particular, the second buffer layer 116 reacts with oxygen from the first buffer layer 114 more strongly than the first buffer layer 114 reacts with oxygen from the metal oxide layer 112. A main consideration in selection of a material of the second buffer layer 116 is that such material is easy to have the oxidation reaction with the first buffer layer 114 compared to the oxidation reaction between the first buffer layer 114 and the metal oxide layer 112. Therefore, the material of the second buffer layer 116 preferably includes Ti, Ta, Zr, Hf, Al, Ni, or other metals that are easy to have the oxidation reaction with the first buffer layer 114. For example, if the first buffer layer 114 uses Ta, the second buffer layer 116 may use Ti. Moreover, a thickness of the second buffer layer 116 is 1~100 nm. The thickness of the first buffer layer 114 is smaller than the thickness of the second buffer layer 116.

Then, a second electrode 118 is formed on the second buffer layer 116, and the second electrode 118 is electrically connected to a word line (not shown). The second electrode 118 includes an electrode material capable of blocking diffusion of oxygen atoms. In other words, regarding selection of the material of the second electrode 118, the properties of blocking diffusion of the oxygen atoms and enough thermal stability are generally considered, and the material is not easy to react with oxygen. According to the above description, the material of the second electrode 118 preferably includes TaN, TiN, Pt, or Ru, and a thickness of the second electrode 118 is about 1~500 nm.

The first electrode 110, the metal oxide layer 112, the first buffer layer 114, the second buffer layer 116 and the second electrode 118 form the memory cell M. After the memory cell M is formed, a heat treatment process is selectively performed. The heat treatment process includes an annealing processing, a microwave heating processing, an electricity-based oxygen ion migration processing or other suitable heat treatment processes. Moreover, a temperature of the heat treatment process is 200~800 degrees Celsius. Here, the heat treatment process may prompt the oxidation reaction between the second buffer layer 116 and the metal oxide layer 112.

The RRAM formed according to the above method includes the substrate 100 and the memory cell M. The substrate 100 has the control device T thereon. The memory cell M is disposed on the substrate 100, and is electrically connected to the control device T, where the memory cell M includes the first electrode 110, the metal oxide layer 112, the electrode buffer stacked layer 200 and the second electrode 118. In other words, the structure of the memory cell M from the bottom to the top is sequentially the first electrode 110, the metal oxide layer 112, the first buffer layer 114, the second buffer layer 116 and the second electrode 118.

According to the above descriptions, when the memory cell M operates, a setting voltage (Vset) is applied to the first electrode 110 and the second electrode 118 to transit the metal oxide layer 112 from a high resistance state to a low resistance state. When a reset voltage Vreset is applied to the first electrode 110 and the second electrode 118, the metal oxide layer 112 is transited from the low resistance state to the high resistance state. In other words, the metal oxide resistor film 112 can be programmed so that a dual state memory circuit may have a high resistance or a low resistance, and each memory cell stores data of one bit. Certainly, a plurality of resistance-determined states can be designed in a multi-state memory circuit, so that a single memory cell stores data of a plurality of bits.

Figure 2:
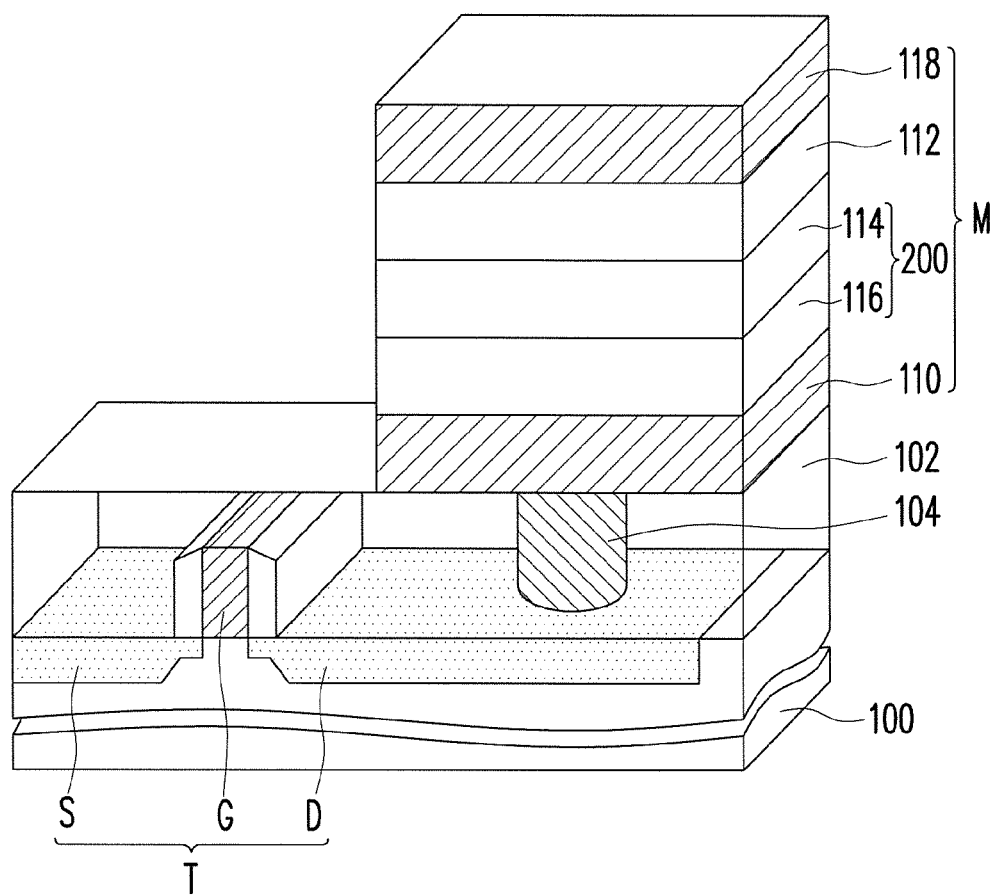
FIG. 2 is a schematic diagram of a RRAM according to another embodiment of the disclosure.

FIG. 2 is a schematic diagram of a RRAM according to another embodiment of the disclosure. Referring to FIG. 2, the RRAM of FIG. 2 is similar to that of FIG. 1, and the same components are denoted by the same symbols, and descriptions thereof are not repeated. In a structure of FIG. 2, the structure of the memory cell M from the bottom to the top is sequentially the first electrode 110, the second buffer layer 116, the first buffer layer 114, the metal oxide layer 112 and the second electrode 118, where the second buffer layer 116 and the first buffer layer 114 form the electrode buffer stacked layer 200.

In the present embodiment, since the first buffer layer 114 that is not easy to have the oxidation reaction with the metal oxide is mainly used to suppress the excessive first time reset current of the memory device, the first buffer layer 114 is disposed between the metal oxide layer 112 and the second buffer layer 116. Moreover, in order to ensure that the second buffer layer 116 that is easy to have the oxidation reaction with the metal oxide may still have the oxidation reaction with the metal oxide layer 112 even if the first buffer layer 114 exists, the thickness of the first buffer layer 114 is preferably smaller than the thickness of the second buffer layer 116, though the disclosure is not limited thereto.

Moreover, in the embodiment of FIG. 2, after the memory cell M is formed, a heat treatment process can also be selectively performed. The heat treatment process includes an annealing processing, a microwave heating processing, an electricity-based oxygen ion migration processing or other suitable heat treatment processes. Moreover, a temperature of the heat treatment process is 200~800 degrees Celsius. Here, the heat treatment process may prompt the oxidation reaction between the second buffer layer 116 and the metal oxide layer 112.

Figure 3:
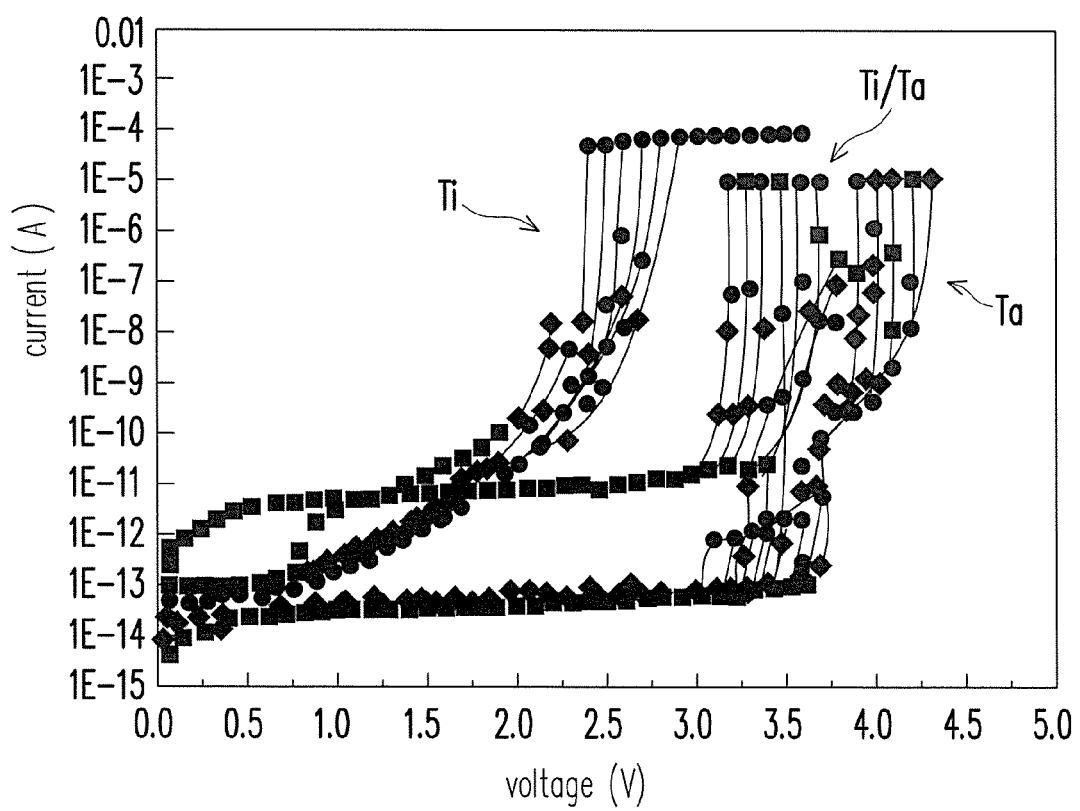
FIG. 3 is a diagram illustrating a relationship of voltages and currents of the RRAM.

FIG. 3 is a diagram illustrating a relationship of voltages and currents of the RRAM. In FIG. 3, a plurality of curves (marked as Ti) to the left represent voltage-current curves of the memory cell of the RRAM in which a single layer of Ti is purely used to serve as the electrode buffer layer. A plurality of curves (marked as Ta) to the left represent voltage-current curves of the memory cell of the RRAM in which a single layer of Ta is purely used to serve as the electrode buffer layer. A plurality of curves (marked as Ti/Ta) in the middle represent voltage-current curves of the memory cell of the RRAM in which a stacked layer of Ti/Ta is used to serve as the electrode buffer layer.

According to FIG. 3, it is known that when the memory cell of the RRAM purely uses the single layer of Ti to serve as the electrode buffer layer, although the forming voltage of the memory cell is relatively low, it has a problem of inadequate reliability of the memory device. When the memory cell of the RRAM purely uses the single layer of Ta to serve as the electrode buffer layer, although the reliability of the memory device is improved, the forming voltage of the memory cell is excessively high. When the memory cell of the RRAM purely uses the stacked layer of Ti/Ta to serve as the electrode buffer layer, the reliability of the memory device and the forming voltage of the memory cell are both taken into consideration.

In summary, in the memory cell of the RRAM of the disclosure, the first buffer layer and the second buffer layer are used as electrode buffer layers. Particularly, the first buffer layer is not easy to have the oxidation reaction with the metal oxide, so that the first time reset current of the memory is decreased to improve reliability of the memory device. Moreover, the second buffer layer is easy to have the oxidation reaction with the first buffer layer, so that the forming voltage of the memory device is decreased.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A method for manufacturing a memory cell of a resistive random access memory, comprising:
   forming a first electrode;
   forming a metal oxide layer on the first electrode;
   forming an electrode buffer stacked layer on the metal oxide layer, wherein the electrode buffer stacked layer comprises a first buffer layer and a second buffer layer, the first buffer layer is located between the metal oxide layer and the second buffer layer, and the second buffer layer reacts with oxygen from the first buffer layer more strongly than the first buffer layer reacts with oxygen from the metal oxide layer;
   forming a second electrode on the electrode buffer stacked layer; and
   performing a heat treatment process after the second electrode is formed, wherein the heat treatment process comprises an annealing processing, a microwave heating processing, or an electricity-based oxygen ion migration processing, and a temperature of the heat treatment process is 200~800 degrees Celsius.

2. The method for manufacturing the memory cell of the resistive random access memory as claimed in claim 1, wherein the first buffer layer comprises Ta, Zr, Hf, Al, Ni, or a metal oxide of the above metal that is not fully oxidized, and a thickness of the first buffer layer is 1~100 nm.

3. The method for manufacturing the memory cell of the resistive random access memory as claimed in claim 1, wherein the second buffer layer comprises Ti, Ta, Zr, Hf, Al, Ni, or a metal oxide of the above metal that is not fully oxidized, and a thickness of the second buffer layer is 1~100 nm.

4. The method for manufacturing the memory cell of the resistive random access memory as claimed in claim 1, wherein a thickness of the first buffer layer is smaller than a thickness of the second buffer layer.

5. The method for manufacturing the memory cell of the resistive random access memory as claimed in claim 1, wherein the first electrode and the second electrode respectively comprise an electrode material capable of blocking diffusion of oxygen atoms.

6. The method for manufacturing the memory cell of the resistive random access memory as claimed in claim 5, wherein the first electrode comprises TaN, TiN, TiAlN, a TiW alloy, Pt, W, Ru or a mixture or a stacked layer of the above materials, and a thickness thereof is about 1~500 nm.

7. The method for manufacturing the memory cell of the resistive random access memory as claimed in claim 5, wherein the second electrode comprises TaN, TiN, Pt, or Ru, and a thickness thereof is about 1~500 nm.

8. The method for manufacturing the memory cell of the resistive random access memory as claimed in claim 1, wherein a chemical formula of the metal oxide layer is $M_xO_y$, in which M represents Al, Hf, Ti, Ta or Zr, and x and y present a stoichiometric ratio or a non-stoichiometric ratio.

9. A memory cell of a resistive random access memory, comprising:
   a first electrode and a second electrode;
   a metal oxide layer, located between the first electrode and the second electrode; and
   an electrode buffer stacked layer, located between the first electrode and the second electrode, wherein the electrode buffer stacked layer comprises a first buffer layer and a second buffer layer, the first buffer layer is located between the metal oxide layer and the second buffer layer, and the second buffer layer reacts with oxygen from the first buffer layer more strongly than the first buffer layer reacts with oxygen from the metal oxide layer, wherein a structure of the memory cell from the bottom to the top is sequentially the first electrode, the second buffer layer, the first buffer layer, the metal oxide layer and the second electrode.

10. The memory cell of the resistive random access memory as claimed in claim 9, wherein the first buffer layer comprises Ta, Zr, Hf, Al, Ni, or a metal oxide of the above metal that is not fully oxidized, and a thickness of the first buffer layer is 1~100 nm.

11. The memory cell of the resistive random access memory as claimed in claim 9, wherein the second buffer layer comprises Ti, Ta, Zr, Hf, Al, Ni, or a metal oxide of the above metal that is not fully oxidized, and a thickness of the second buffer layer is 1~100 nm.

12. The memory cell of the resistive random access memory as claimed in claim 9, wherein a thickness of the first buffer layer is smaller than a thickness of the second buffer layer.

13. The memory cell of the resistive random access memory as claimed in claim 9, wherein the first electrode and the second electrode respectively comprise an electrode material capable of blocking diffusion of oxygen atoms.

14. The memory cell of the resistive random access memory as claimed in claim 13, wherein the first electrode comprises TaN, TiN, TiAlN, a TiW alloy, Pt, W, Ru or a mixture or a stacked layer of the above materials, and a thickness thereof is about 1~500 nm.

15. The memory cell of the resistive random access memory as claimed in claim 13, wherein the second electrode comprises TaN, TiN, Pt, or Ru, and a thickness thereof is about 1~500 nm.

16. The memory cell of the resistive random access memory as claimed in claim 9, wherein a chemical formula of the metal oxide layer is $M_xO_y$, in which M represents Al, Hf, Ti, Ta or Zr, and x and y present a stoichiometric ratio or a non-stoichiometric ratio.

* * * * *